United States Patent
Beatson et al.

(10) Patent No.: US 7,294,217 B2
(45) Date of Patent: Nov. 13, 2007

(54) ELECTRICAL INTERCONNECT STRUCTURES FOR INTEGRATED CIRCUITS AND METHODS OF MANUFACTURING THE SAME

(75) Inventors: David T. Beatson, Kennett Square, PA (US); Horst Clauberg, Lafayette Hill, PA (US); Kenneth K. Dury, Kihei, HI (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 47 days.

(21) Appl. No.: 10/552,429

(22) PCT Filed: Apr. 9, 2004

(86) PCT No.: PCT/US2004/010861

§ 371 (c)(1),
(2), (4) Date: Aug. 17, 2006

(87) PCT Pub. No.: WO2004/093185

PCT Pub. Date: Oct. 28, 2004

(65) Prior Publication Data

US 2007/0026574 A1  Feb. 1, 2007

Related U.S. Application Data

(60) Provisional application No. 60/461,776, filed on Apr. 9, 2003.

(51) Int. Cl.
  *B32B 37/00* (2006.01)
(52) U.S. Cl. .................. 156/73.1; 228/110.1
(58) Field of Classification Search ............... 156/73.1, 156/580.1, 580.2; 228/110.1, 1.1; 438/653, 438/660, 687
See application file for complete search history.

(56) References Cited

U.S. PATENT DOCUMENTS

| 6,156,990 | A  | 12/2000 | Ellis |
| 6,352,743 | B1 | 3/2002  | Ellis et al. |
| 6,413,576 | B1 | 7/2002  | Ellis et al. |
| 6,534,877 | B2 | 3/2003  | Ellis et al. |

(Continued)

FOREIGN PATENT DOCUMENTS

WO  WO 01/01478 A  1/2001

(Continued)

OTHER PUBLICATIONS

Noguchi J. et al: "Effect of NH3-Plasma Treatement and CMP Modification on TDDB Improvement in U Metallization", IEEE Transaction on Electron Devices, vol. 48, No. 7, IEEE Inc. NY, US, Jul. 2001.

(Continued)

*Primary Examiner*—James Sells
(74) *Attorney, Agent, or Firm*—Christopher M. Spletzer, Sr.

(57) ABSTRACT

Disclosed are interconnect structures and methods which utilize a bonding surface comprising copper nitride. The interconnect structures include a bonding surface comprising copper nitride which is effective at preventing oxidation and/or other unwanted corrosion of the underlying conductive material while providing the basis for a high conductivity bond. The copper nitride bonding surface provides a relatively non-conductive, corrosion-resistant bonding surface while at the same time being readily transformed into a conductive layer at or just prior to the time of bonding.

20 Claims, 4 Drawing Sheets

U.S. PATENT DOCUMENTS

| | | |
|---|---|---|
| 6,599,561 B2 | 7/2003 | Dow et al. |
| 6,885,104 B2 | 4/2005 | Ellis et al. |
| 2002/0155702 A1* | 10/2002 | Aoki et al. ................ 438/653 |
| 2002/0168845 A1 | 11/2002 | Ellis et al. |
| 2004/0087150 A1* | 5/2004 | Ramm ....................... 438/687 |

FOREIGN PATENT DOCUMENTS

| | | |
|---|---|---|
| WO | WO 01/01478 A | 4/2001 |
| WO | PCT/US2004/155702 A1 | 10/2002 |
| WO | PCT/US2004/087150 A1 | 5/2004 |
| WO | PCT/US2004/087150 | 6/2004 |

OTHER PUBLICATIONS

Maruyama T.; Morishita T. "Copper Nitride Thin Films Prepared by Radio Frequency Reactive Sputtering" J. Appl. Physics, vol. 78, No. 6, Sep. 1995.

* cited by examiner

ELECTRICAL INTERCONNECT STRUCTURES FOR INTEGRATED CIRCUITS AND METHODS OF MANUFACTURING THE SAME

CROSS REFERENCE TO RELATED APPLICATIONS

This application is the National Stage Filing of PCT Application No. PCT/US04/010861 filed on Apr. 9, 2004 which, in turn, claims priority benefit under 35 U.S.C. Section 119(e) of U.S. Provisional Application No. U.S. 60/461,776 filed on Apr. 9, 2003. The contents of both applications are hereby incorporated by reference.

FIELD OF THE INVENTION

The present invention relates to the field of interconnect structures for integrated circuit packages and to methods of fabricating same, and more particularly to copper interconnect structures for electrically connecting two or more electronic components.

BACKGROUND

Interconnection technology is an important aspect of the fabrication of electronic components containing semiconductor devices. For example, in chip bonding, the back of a chip is mechanically attached to an appropriate medium, such as a ceramic substrate, a paddle of a metal lead frame or to a ball grid array (BGA). The upper level of wiring for the chip normally includes bond pads which are electrically attached, via the necessary connections, to the underlying circuit. The chip commonly has a protective overcoat (PO) layer, generally referred to as passivation, with holes providing access to the bond pads. The bond pads on the circuit side of the chip are electrically connected to the package leads by wires or other electrical conductors to permit utilization of the integrated circuit (IC). The type of interconnection scheme which is used can vary widely, depending on the desired characteristics of the packaging involved. For example, thin wires are typically used as part of the interconnection, and these may be ultrasonically bonded to the bond pad (sometimes referred to herein as "wire bonding") or by the formation of solder balls which make a direct connection between the bond pad on the chip and a substrate (as in the flip chip process). Other common methods for making IC interconnections, such as connecting the bond pads to the leads of the lead frame, or the conductors of other conductor support devices, include Tape Automated Bonding (TAB), Controlled Collapse Chip Connection (C4) or bump bonding, and through the use of conductive adhesives.

Aluminum has heretofore frequently been the material of choice for use in the formation of the interconnect elements, such as the metal traces of the semiconductor circuit, the bond pads and (for large pitch applications) wires. However, the desirability of using aluminum has recently been affected by the pressure in the IC industry to reduce the cost and size of IC devices and to increase the input/output capacity and speed of such devices. This pressure has increased the need for finer traces on the semiconductor and finer pitch interconnections, which frequently require thinner and sometimes longer wires. As a result, some of the deficiencies of aluminum and its alloys, such as relatively high resistance to current flow, reliability and electromigration have sparked a need for more reliable, and higher conductivity metals for use in the IC circuitry. Fine-pitch interconnections between semiconductor devices and a supporting substrate, such as a leadframe or BGA, are usually made using thin gold wires. The high cost of gold and the combination of higher speed and thinner wires have also created a need for a higher conductivity and lower cost metal for fine-pitch wire bonding.

To address these issues, a metal that has received increased attention is copper. While copper has a significantly lower resistivity than aluminum or gold, its use in interconnect devices posses a set of problems that are not present with the use of aluminum or gold. For example, the formation of an interconnect to copper bond pads will generally require that the copper is exposed to ambient air and humidity prior to formation of the connection to the bond pad, and to air, humidity and elevated temperatures near 200° C. during the process of forming the connection. This creates a significant problem because of the rapid formation of a tenacious nonconductive oxide on the surface of the metal, even at room temperature. The presence of these copper oxides generally prevents the formation of good wire bonds or solder ball connections to bare copper surfaces. Similarly, copper wire usually has a limited shelf life due to the formation of a thin layer of oxides on its surface even when stored under conditions of relatively low oxygen concentration and low humidity. This copper oxide layer will have an unacceptably negative impact on the conductivity of the connection.

In the case of copper metallization on semiconductors, one commonly used solution to this problem has been to deposit a thin layer of a more oxidation-resistant metal on the bond pad so as to protect it from oxidation. Typically, this second layer of metallization is formed from gold or aluminum, as disclosed in U.S. Pat. No. 5,785,236. This is typically accomplished by vapor deposition of a layer of the metal onto the semiconductor wafer using a mask. However, this proposed solution creates several of its own problems. For example, another set of lithography steps is then required to pattern, mask and etch the metal, and thereby form bond pads which can be wire bonded. Such additional wafer processing steps add significantly to the cost of the devices. Furthermore, when aluminum or gold is bonded to the copper, thin intermediate barrier layers of other metals are usually required to prevent the interdiffusion of the copper into the gold or aluminum or vise versa.

For example, U.S. Pat. No. 4,987,750 describes the use of titanium nitride (TiN), tungsten (W), tungsten nitride (WN), zirconium nitride (ZrN), titanium carbide (TiC), tungsten carbide (WC), tantalum (Ta), tantalum nitride (TaN), or titanium tungsten (TiW) as barrier layers for copper. Many of these materials, however, also form nonconductive oxides, or have poor electrical or thermal conductivity, or a high thermal expansion.

Most recently, it has been proposed to utilize a frangible layer of a ceramic insulator, such as silicon oxide or silicon nitride, that have a thickness suitable for soldering without fluxing and that are sufficiently frangible during ball or wedge bonding to obtain metal to metal contact between the bonding surface and the wire to be bonded. Such a process is disclosed in U.S. Pat. No. 6,352,743, which is assigned to the assignee of the present invention. While this process has several advantages and desirable characteristics, it can be problematic if the process steps are not precisely controlled. For example, if the ceramic layer is not sufficiently frangible, a substantial drop in conductivity can result, potentially in certain cases even preventing the formation of a connection.

For copper lead frames, the tip of the leads to which bond are made are usually coated with an oxidation resistant metal, usually silver. These approaches have the obvious disadvantage of increasing the costs and complexity and time of the manufacturing process. For solder-ball bumping, a flux would be required to remove the oxide during the reflow process.

Accordingly, there continues to be a need for an interconnect structure that will simplify the formation of high conductivity bonding. A copper bond pad with a suppressed oxide growth layer having good electrical conductivity, good thermal conductivity, and low thermal expansion is also needed, as well as a simple process for forming such copper bond pads.

The present invention meets these needs and offers additional advantages as discussed in the following summary and description of preferred embodiments.

SUMMARY OF THE INVENTION

Applicants have discovered a solution which overcomes the problems noted above and which provides other beneficial and desirable results. More particularly, the present invention relates to interconnect structures and methods which utilize a bonding surface comprising copper nitride. Applicants have discovered that interconnect structures which include a bonding surface comprising copper nitride can be highly effective at preventing oxidation and/or other unwanted corrosion of the underlying conductive material while at the same time providing the basis for a high conductivity bond. Furthermore, applicants' invention provides the advantage of simplifying and/or reducing the cost of the manufacturing process. These benefits derive, at least in part, from applicants' recognition and discovery that copper nitride is capable of providing in such structures a relatively non-conductive, corrosion-resistant bonding surface while at the same time being readily transformed into a conductive layer at or just prior to the time of bonding. According to certain embodiments of the method aspects of the present invention, an interconnect bonding structure is formed by providing a conductive base material having a relatively non-conductive, corrosion-resistant bonding surface comprising Cu(N), forming an electrically conductive bond in the region of said bonding surface; and prior to or substantially simultaneously with said bond forming step, decomposing a sufficient amount of the Cu(N) in said bonding surface to produce a substantial increase in the conductivity of the layer containing the Cu(N) and thereby forming a relatively conductive bonding surface. Preferably the decomposing step causes a change in conductivity sufficient to produce a commercially acceptable electrical connection.

In preferred embodiments of the present invention, the interconnect structure comprises at least one interconnect element selected from the group consisting of a copper bond pad, a copper wire, a copper lead frame, copper stud bumps, and combinations of two or more of these. It is also generally preferred that the interconnect element having a Cu(N) bonding surface of the present invention is bonded to another interconnect element by a bonding process that involves the application of energy, such as heat, pressure, and/or ultrasonic energy, and in the case of wire bonding embodiments preferably heat, pressure and ultrasonic energy, in the region of the bond. In other applications, an ionized gas (plasma) or light from a laser may be used to provide the energy for decomposing the Cu(N) layer. One particular application of laser light for this purpose may be the use of a laser to melt solder balls on copper pads that have a copper nitride coating, which would decompose to copper during the melting process.

The term "non-conductive" is used herein in a relative sense to refer to conductivity which is substantially less than the conductivity of the material which forms the conductive portion, or the base, of the interconnect element. Similarly, the term corrosion resistant is used herein in a relative sense to refer to a resistance to corrosion in general, and to oxidation in particular, that is substantially greater than the resistance to corrosion of the metal, and preferably the copper or copper alloy, which forms the conductive portion of the interconnect element.

Cu(N) has a conductivity far lower than does copper, which is a preferred conductive material for many interconnect elements, such as bond pads, wires and lead frames. Because of this low conductivity, those skilled in the art would be strongly motivated to avoid the use of Cu(N) in the bonding surface of interconnect elements. However, applicants have come to appreciate that Cu(N) is also relatively unstable, particularly under the conditions which are frequently encountered as a surface is prepared for and/or exposed to bonding operations. These bonding operations all include the application of some form of energy, such as thermal energy, kinetic energy, radiant energy, photonic energy, or combinations of two or more of these. For example, energy sufficient to decompose the Cu(N) so as to substantially increase the conductivity of the layer containing the Cu(N) is generally present in thermosonic or ultrasonic wire bonding (including ball and wedge bonding) as well as solder bumping or stud bumping, as used for example in flip chip processes. Thus, under the appropriate conditions, which frequently are present in many bonding operations, the layer or surface which contains the Cu(N) is converted to a relatively high conductivity surface layer. Without necessarily being bound to any particular theory of operation, it is believed that this conversion results from the decomposition of Cu(N) to elemental copper and nitrogen, the later of which is released from the layer as a gas.

Further, it is believed that copper-nitrogen mixtures, even with only a small amount of nitrogen included, are effective at reducing electrical conductivity and increasing corrosion resistance. It is also believed that such mixtures are also readily decomposed to copper and nitrogen and thus are capable, under the appropriate conditions, of being converted to a highly conductive layer just prior to or at about the time the bond is formed. Accordingly, the term "Cu(N)" is used herein to mean and identify all phases and compounds consisting essentially of nitrogen and copper. The notation "Cu(N)" as used herein thus indicates that some or all of nitrogen may be bound (covalently and/or ionically) to the copper, such as in $Cu_3N$, but is not limited to this compound. Thus, the notation "Cu(N)' also covers the possible, but less common, stoichiometry $Cu_4N$ and other effective stoichiometries and/or combinations of copper and nitrogen.

The non-conductive nature of the Cu(N) and the methods of forming it present another advantage in that no mask is required to form it on a semiconductor device. In some embodiments, the Cu(N) may be applied over the entire device or over large potions of the device without a mask without forming electrical shorts between bond pads because Cu(N) is essentially non-conducting. In other embodiments, the Cu(N) may be formed by converting a surface layer of existing copper interconnect elements to Cu(N). In this manner, no Cu(N) is formed between separate copper interconnect elements, such as bond pads.

DESCRIPTION OF PREFERRED EMBODIMENTS

Figure 1:
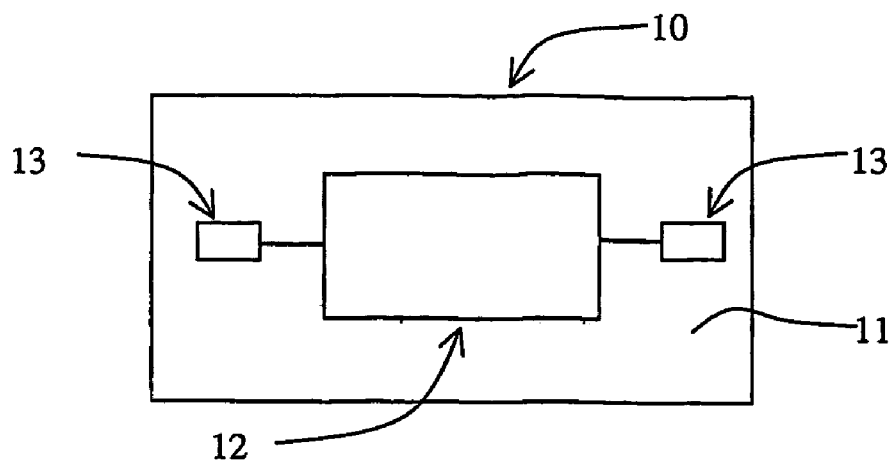
FIG. 1 is a top view of a portion of an exemplary semiconductor die prior to the bonding operation according to one embodiment of the present invention.

In the following description, reference is made to various specific embodiments of the invention. These embodiments are described with sufficient detail to enable those skilled in the art to practice the invention, and it is to be understood that other embodiments may be employed, and that structural, electrical and methodology changes may be made and equivalents substituted without departing from the invention. Accordingly, the following detailed description is not to be taken in a limiting sense and the scope of the present invention is defined by the appended claims.

The present invention is intended for use with any type of interconnect structure or element now used or which in the future may be used as part of or in association with a semiconductor device, such as a chip or die, including wafers which contain such devices. The inventive interconnect structures of the present invention are formed from any two or more interconnect elements that are bonded to one another. Such elements may therefore include, but are not limited to, conductive wires, lead frames and/or portions of lead frames, bond pads and/or portions of bond pads, stud bumps, inter-chip traces and any other connections that will be exposed to a bonding process. In preferred embodiments, the inventive interconnect structures and methods of the present invention are used in the formation of an IC package containing a die, a lead frame and conductive wire connecting the die to the lead frame, as described below in connection with the Figures hereof. In certain highly preferred embodiments, the interconnect structure comprises a copper bond pad on a die, a copper lead frame (or a copper bonding portion of a lead frame) and copper wire bonded to and electrically connecting each, wherein prior to bonding at least one of these interconnect elements had a bonding surface comprising Cu(N).

As used herein, the term "chip" and "die" are used interchangeably and each refers to a relatively small piece of semiconductor material on which an integrated circuit or discrete electronic circuit element, such as a transistor, capacitor, diode or the like, is embedded. These electronic circuit elements or integrated circuit may also include optoelectronic devices such as light-emitting diodes, laser diodes, etc. Alternatively, the chip or die or a portion thereof may be a micro electromechanical system (MEMS).

As used herein, the terms "interconnect" and "interconnect structure" are used interchangeably and each means at least two highly conductive elements bonded to one another and which together carry electrical signals to different parts of a chip or die, and/or to and from a chip or die. Such highly conductive elements are sometimes referred to herein as "interconnect elements." It will be appreciated by those skilled in the art that the present invention is not limited to a particular form of interconnect structure, but may be used with any combination of interconnect elements, such as conductive wires, lead frames, bond pads, stud bumps, TAB, C4 or solder bumps, conductive adhesives, and the like. Although many interconnect structures are adaptable for use with the present invention, exemplary and preferred are interconnect structures formed by a process which comprises providing at least one interconnect element having a substantially non-conductive and substantially corrosion-resistant bonding surface comprising Cu(N), converting the non-conductive bonding surface to a conductive bonding surface and bonding the converted surface to a second interconnect element. In highly preferred embodiments, the converting step and the bonding step occur substantially simultaneously. In other words, it is preferred that the bonding step is carried out under conditions which are effective to decompose the Cu(N) in the bonding layer to conductive copper. As those skilled in the art will appreciate, such a process has substantial and highly desirable advantages. More particularly, such preferred processes provide interconnect elements that at once have: (1) a relatively long shelf life due to the presence of a corrosion resistant, non-conductive bonding surface; and (2) the ability to be easily and readily used in an interconnect structure without degradation of the conductivity of the interconnect. Moreover, since the surface material of the present invention is non-conductive, it can be applied in situ to the bond pad located on a die without concern about causing shorts between bond pads on the die. In a preferred embodiment of the present invention, an existing copper surface of the interconnect structure is chemically converted to Cu(N). As a result, the surface material of the present invention can be applied without the need for a masking step or a subsequent etching step. The term "bond pad" as used herein refers to and is intended to include and encompass all suitable terminal structures to which a bond may be made, including both elevated and recessed bond pads as well as flat, concave or convex bond pads and other terminal structures.

It is contemplated that numerous combinations of bonding conditions can be used to decompose Cu(N) in view of the teachings contained herein, and all such conditions are within the scope of the present invention. Nevertheless, it is contemplated that in certain preferred embodiments the bonding step will comprise exposing the Cu(N)-containing layer to a temperature of at least about 150° C. More particularly, for bonding based on BGA interconnects, it is preferred that the Cu(N)-containing layer is exposed to a temperature of from about 150° C. to about 180° C. For bonding based on metal lead frame interconnects, it is preferred that the Cu(N)-containing layer is exposed to a temperature of from about 180° C. to about 240° C. and even more preferably from about 190° C. to about 230° C.

Figure 2:
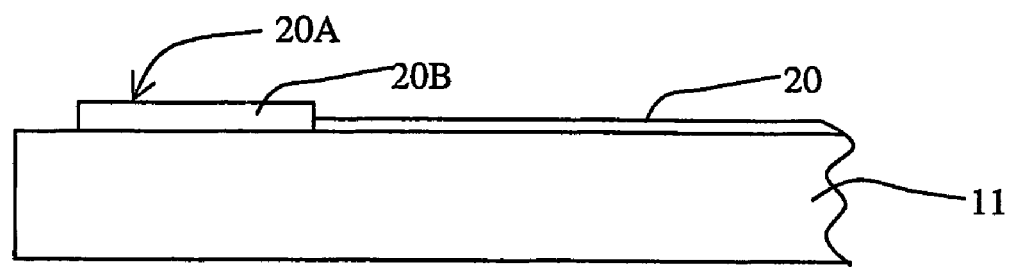
FIG. 2 is a cross-sectional view of the semiconductor die of FIG. 1.

Referring now to the drawings, where like elements are designated by like reference numerals, preferred methods and apparatus of the present invention will be described in connection with FIGS. 1-3. FIG. 1 shows a semiconductor die 10 of conventional construction comprising a semiconductor substrate 11 and an integrated circuit 12 formed thereon. The term "semiconductor substrate" as used herein refers to and includes any semiconductor-based support structure or base material of a chip, integrated circuit, or printed circuit board. The term semiconductor substrate is to be understood as including silicon-on-insulator, doped and undoped silicon, and other semiconductor structures. Furthermore, when reference is made to a semiconductor substrate previous process steps may have been utilized to form regions or junctions in or over the base semiconductor structure or foundation. Semiconductor substrate 11 in FIG. 2 is shown as a single layer for simplicity, but in fact it may include a base substrate and various material layers as needed to form an integrated circuit 12. Terminal contacts 13 are connected electrically to the internal integrated circuit 12. For simplicity, FIG. 1 shows only two terminal contacts. It will be apparent, however, that in many actual applications, many more terminal contacts are associated with the integrated circuit 12.

During the typical IC manufacturing processes, the die 10 is fabricated on a wafer with a large number of other dies. Each die 10 on the wafer may subsequently be singulated by saw cutting or other suitable means. As it will be described further, the upper levels of the die 10 containing integrated circuit 12 include an interconnect element in the form of an upper conductive layer 20 having a bond pad 20B therein. In preferred embodiments, layer 20 is metal, preferably copper where the Cu(N) layer of the present invention is incorporated into a surface of the bond pad. It should be appreciated, however, that the present invention comprises the use of other types of metal as the base material for one or more elements of the interconnect structure. For example, if a particular embodiment utilizes copper wire with a bonding surface of the present invention, the base metal of the bond pad to which such a wire will be bonded may or may not be copper. Furthermore, it is contemplated that in certain embodiments, a Cu(N) layer of the present invention may be formed as a bonding surface on a base metal that is not copper. All such embodiments are within the broad scope of the present invention. The surface of area 20A to which another interconnect element, such as a conductive wire, preferably a copper or gold wire, and more preferably a copper wire, is bonded is the bonding surface of the copper bond pad.

Figure 3:
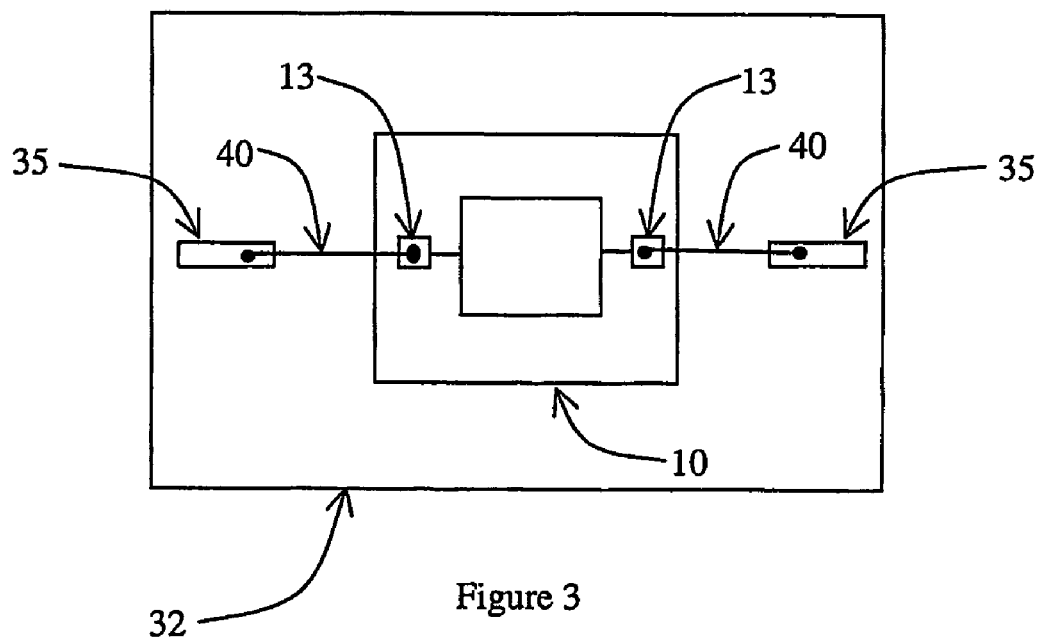
FIG. 3 is a top view of an integrated circuit package containing the semiconductor die of FIG. 1 electrically connected to a circuit substrate after the bonding operation according to one embodiment of the present invention.

FIG. 3 illustrates the interconnection between the semiconductor die 10 and a circuit substrate 30. The circuit substrate 30 may be a lead frame, ball grid array, chip carrier, or other support structure which, in connection with the die 10, produces an IC package 32. A conductive interconnect element, such as surface circuit trace, or in the case of the lead frame shown in FIG. 3, a set of inner leads 35, are included on the circuit substrate 30. During packaging, an electrical connection 40 is formed between the bond pad 20B portion of terminal connection 13 and the inner leads 35 on the circuit substrate. Although the electrical interconnect element 40 may be fabricated as a bump, wire, conductive adhesive, and/or tape in accordance with the broad aspects of the present invention, it is generally preferred that the element 40 comprises a wire, preferably a copper wire which has been ball or wedge bonded to the bond pad 20B.

In accordance with the preferred methods of the present invention, one or more of the interconnect elements, namely, the bond pad 20B, the inner lead 35, and the wire bond 40 include at the respective bond site a bonding surface in accordance with the present invention. In certain embodiments, all three elements will include the bonding surface of the present invention. Referring once again now to FIG. 2, the preferred bond pads 20B comprise a bonding surface 20A overlying the conductive copper in the bonding region.

The conductive copper layer 20 may be of any suitable thickness, for example, approximately 0.1 micron to 5 micron.

The bonding surface 20A may be formed in accordance with a wide variety of specific techniques in view of the teachings contained herein, and all such techniques are within the broad scope of the present invention, provided the bonding surface is effective to protect the underlying conductive layer from degradation and does not substantially impair the conductivity of the interconnect structure after the bond is formed. In preferred embodiments, the bonding surface of the present invention comprises sufficient Cu(N) to produce a layer with an average Cu:N molar ratio of no greater than 15:1, more preferably from about 10:1 to about 1:1, and even more preferably from about 8:1 to about 2:1. In certain embodiments, the bonding surface layer of the present invention preferably comprises at least about 5% on an atom basis of nitrogen, and even more preferably at least about 8%. In such embodiments, it is also generally preferred that the concentration of oxygen in the bonding surface layer is not greater than about 15% on an atom basis. In certain preferred embodiments, the bonding layer consists essentially of $Cu_3N$. In this regard it should be noted that the Cu(N) layer may contain one or more contaminants that do not negatively affect the operation of the present invention. As illustrated in the Examples, the layer which consist essentially of Cu(N) includes both carbon and oxygen as contaminants which do not negatively effect operation of the invention. It is also contemplated that in certain embodiments moderate amounts of one or more copper oxides may be present without deleterious effect Further, it is believed that the thickness of the bonding surface layer of the present invention may vary widely within the broad scope hereof and is dependent on the specific application. In certain preferred embodiments, the bonding surface layer has a thickness of at least about 20 Angstroms, more preferably from about 25 Angstroms to about 3000 Angstroms, and even more preferably from about 50 Angstroms to about 500 Angstroms. For copper nitride coated wire, the preferred bonding surface has a thickness of at least 30 Angstroms, more preferably from about 100 Angstroms to about 20,000 Angstroms, and most preferably from about 200 Angstroms to about 10000 Angstroms. In preferred embodiments in which a Cu(N) surface is used on a bonding wire, the Cu(N) on the wire will be decomposed/converted back to copper and nitrogen during the ball forming process, and particularly during the portion of the process which utilizes an electric discharge called electric flame off, EFO. In this way, the Cu(N) is removed from the bonding surface just prior to making the bond. In preferred embodiments, the EFO is carried out in an inert gas or reducing gas atmosphere, such as nitrogen, argon, helium or forming gas.

It is contemplated that in certain applications a Cu(N) bonding surface may be formed on a conductive layer, such as layer 20 shown in the Figures or on metal wire, for example, copper wire, by applying directly to the underlying base of conductive material a coating or layer of an appropriate Cu(N)-containing material. Such techniques include, but are not limited to: reactive sputtering of copper or evaporation of copper in nitrogen to deposit a layer comprising Cu(N) on the conductive material; chemical vapor deposition; and electrochemical techniques. The sputtering or evaporation of the copper may be carried out by any of the methods known in the art, including but not limited to direct current or alternating current discharges, such as radio-frequency or microwave techniques, or evaporation of copper by direct heating, electrical heating, hollow cathode discharge or electron or ion bombardment. The sputtering or evaporation may be carried out in any of the deposition apparatus known to those skilled in the art, including the standard "high" vacuum techniques as well as low vacuum techniques, i.e. the pressure during the deposition may range from only a few mtorr to essentially one atmosphere. Suitable techniques are described in "Principals of Plasma Discharges and Materials Processing" by M. A. Lieberman and A. J. Lichtenberg (John Wiley and Sons, New York, 1994), which is incorporated herein by reference, particularly Chapter 16, and also in, for example, the following U.S. patents, each of which is also incorporated herein by reference: U.S. Pat. Nos. 5,356,673; 5,571,332; 5,725,672 and 4,788,082. Less preferred methods would include the dissociation of a volatile copper-organometallic compound in a plasma. Since such steps do not require the presence of copper in the underlying conductive element, these techniques are particularly well suited for use with interconnect elements that are not predominantly copper. It will be appreciated, however, that these techniques are also available for use with conductive layers which are predominately copper. As used herein, it should be understood that the term "copper" includes not only elemental copper, but copper with other trace metals or in various alloyed combinations with other metals as known in the semiconductor art, as long as such alloy is conductive.

For other embodiments in which the conductive layer comprises or consists predominately of copper the Cu(N) bonding surface may be formed by using copper from the conductive layer. The following is a non-limiting list of steps which can be used, either separately or in combination, to form layers in this manner: conversion of surface of the copper layer to Cu(N) by thermal treatment of the base material with gaseous ammonia, optionally but preferably with a concurrent or prior treatment of the surface with oxygen at elevated temperatures; plasma treatment of the copper base layer with ammonia or nitrogen, optionally but preferably with concurrent or prior treatment of the surface with oxygen; and nitrogen implantation into the surface of the copper base layer by standard ion implantation or plasma immersion ion implantation. Conversion of a copper surface or oxidized copper surface with nitrogen plasma to a layer of surface in accordance with the present invention may be performed by any of the methods known in the art in view of the teachings contained herein. For example, the nitrogen plasma may be produced by alternating current (AC) or direct current (DC). In general, an AC process will be preferred due to non-conducting or poorly conducting nature of the copper nitride being produced. In some cases it may be advantageous to use a DC bias in conjunction with an AC electric field. The frequency of the AC field may be any of those known in the art for plasma processes, including radio and microwave frequencies. The background pressure in which the plasma is formed may range from only a few mtorr to pressures near one atmosphere. In some embodiments the plasma may be formed by a DC or AC discharge at a relatively high pressure of between about 1 torr and about 1000 torr, preferably between about 1 torr and about 200 torr, and then expanded into a lower pressure region of the apparatus where it impinges upon the substrate. It will also be understood by those skilled in the art that the nitrogen or ammonia gas may be only one component of the gas in which the plasma is produced. In some applications and especially for plasmas produced at relatively high pressure, the nitrogen or ammonia may be diluted in another gas, such as helium or argon, to facilitate the formation of the plasma. For copper bond pads and copper lead frame bonding, a highly preferred method of bond formation comprises thermal treatment with oxygen and concurrent or subsequent treatment with ammonia.

Applicant has surprisingly and counter-intuitively found that the pretreatment of the surface with oxygen, preferably oxygen and heat together, actually produces results that are substantially superior to treatment with nitrogen, for example ammonia, alone. At present the reason for such superior results are unknown. The intermediate copper oxide may also be formed by other techniques well known to those skilled in the art. Such alternative techniques would include treatment with oxidizing chemical compounds other than oxygen gas, such as for example hydrogen peroxide, or electrochemical techniques.

EXAMPLES

Example 1

Figure 4:
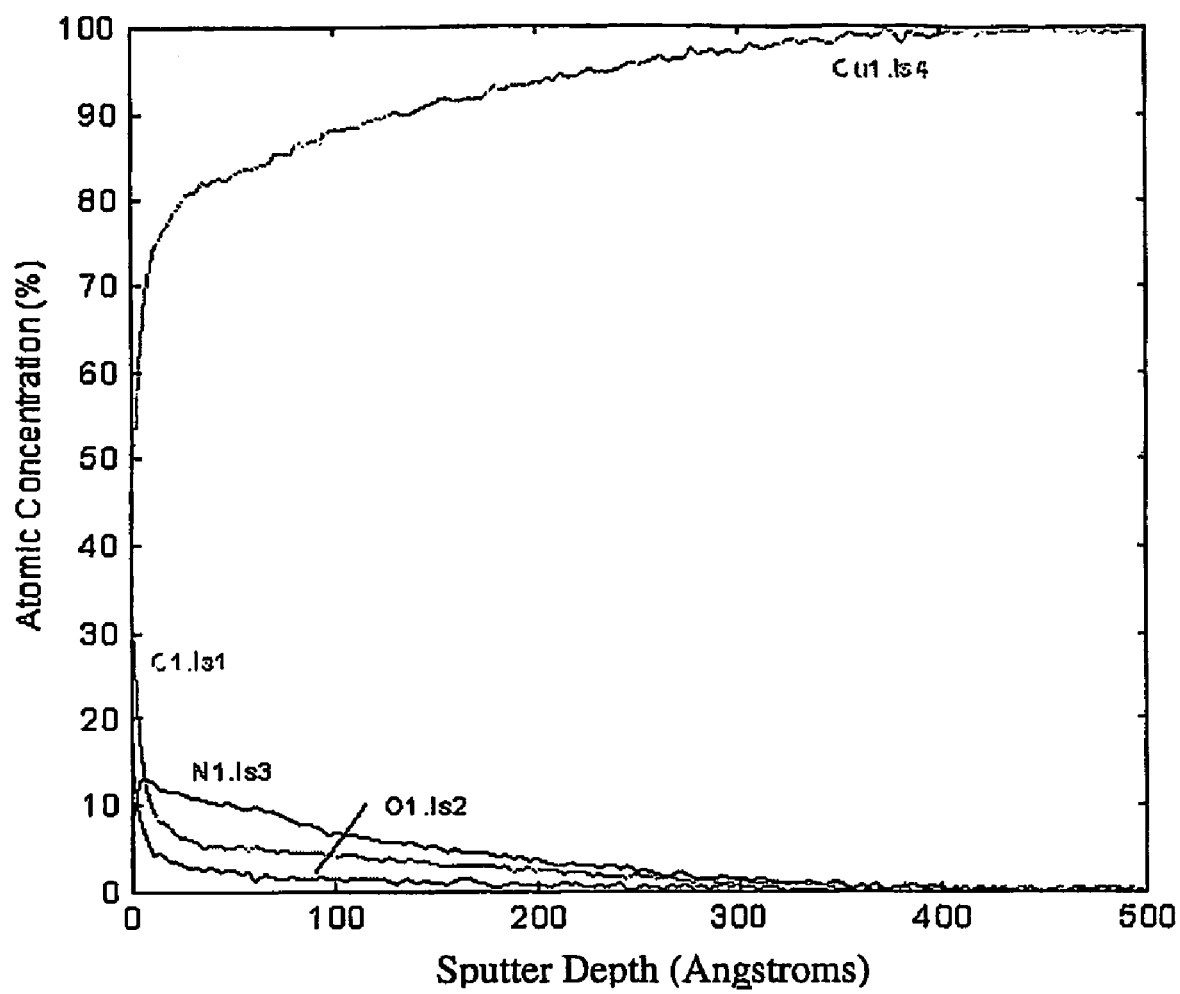
FIG. 4 is an Auger depth profile of the elemental composition for the sample in Example 1. The depth indication is based on an assumed sputter rate for silicon dioxide.

A silicon die comprising a substrate and a conductive copper layer, of the general type illustrated in FIG. 2, is provided. The conductive copper layer is 10,000 Angstroms and forms the base for a bond pad on the die. A protective surface is formed on the bond pad by first pre-treating the bonding surface with a gaseous composition consisting of about 95 mole % nitrogen ($N_2$) and 5 mole % of hydrogen ($H_2$). The surface is exposed to this first pre-treating gas at a temperature of about 400° C. for about nine (9) hours to produce a bonding surface that is substantially free of copper oxide. The bonding surface is then exposed to a second pre-treating step by exposure to a gaseous composition consisting essentially of oxygen ($O_2$) at a temperature of about 200° C. for about five (5) minutes to produce a copper oxide layer with a well-controlled thickness. The oxide layer is then treated with anhydrous ammonia for 5 hours at about 275° C. to produce a substantially non-conductive surface layer about 200 Angstroms thick. The color of the surface changed from the characteristic copper color to blue-green. This layer is a mixture of copper and copper nitride, with smaller amounts of oxygen and carbon, according to the Auger spectrum analysis illustrated in FIG. 4. The Cu:N molar ratio in the layer is about 85:10. The bonding surface thus produced substantially prevents oxidation of the underlying copper and has a conductivity that is substantially less than the conductivity of the underlying copper base of the bond pad. After copper wire bonding to the bond pad under the conditions specified below, the conductivity of the interconnection is sufficient to provide a good electrical contact to the semiconductor device.

Example 2

Figure 5:
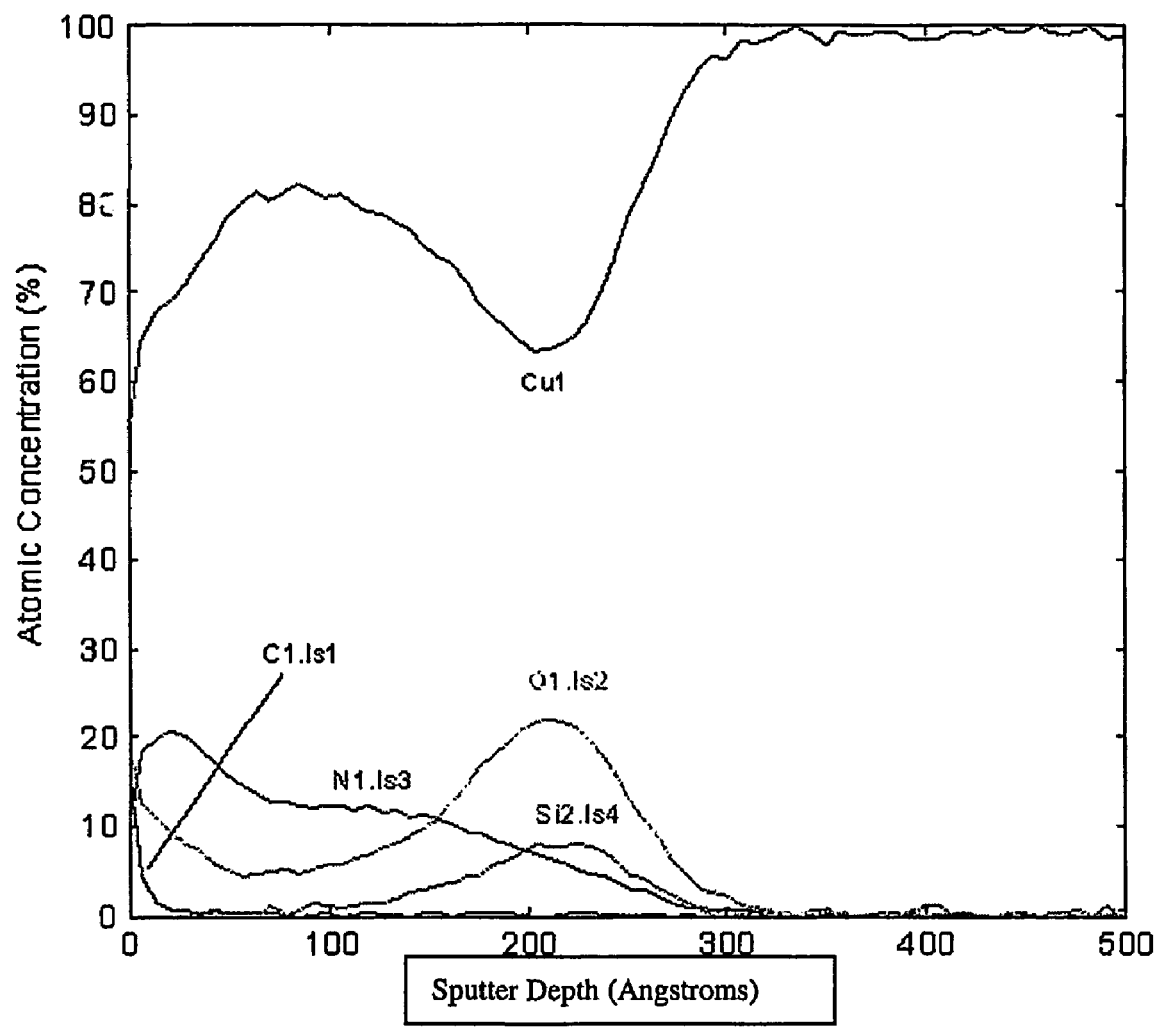
FIG. 5 is an Auger depth profile of the elemental composition for the sample in Example 2. The depth indication is based on an assumed sputter rate for silicon dioxide.

Copper nitride is deposited onto a quarter of an 8-inch silicon wafer with a uniform 1 micron thick copper coating by radio-frequency sputtering of a copper target in an atmosphere of approximately 4 mtorr nitrogen. A 200 Angstrom deposit is produced at a sputtering rate of approximately 33 Angstrom per minute. During the process, the wafer is heated to 100° C. FIG. 5 shows a Auger depth profile of the elemental composition. The Auger data clearly indicates a copper nitride coating with a thickness of about 200 Angstrom. The silicon and oxygen are most likely contaminants present on the wafer before the experiment.

Example 3

Figure 6:
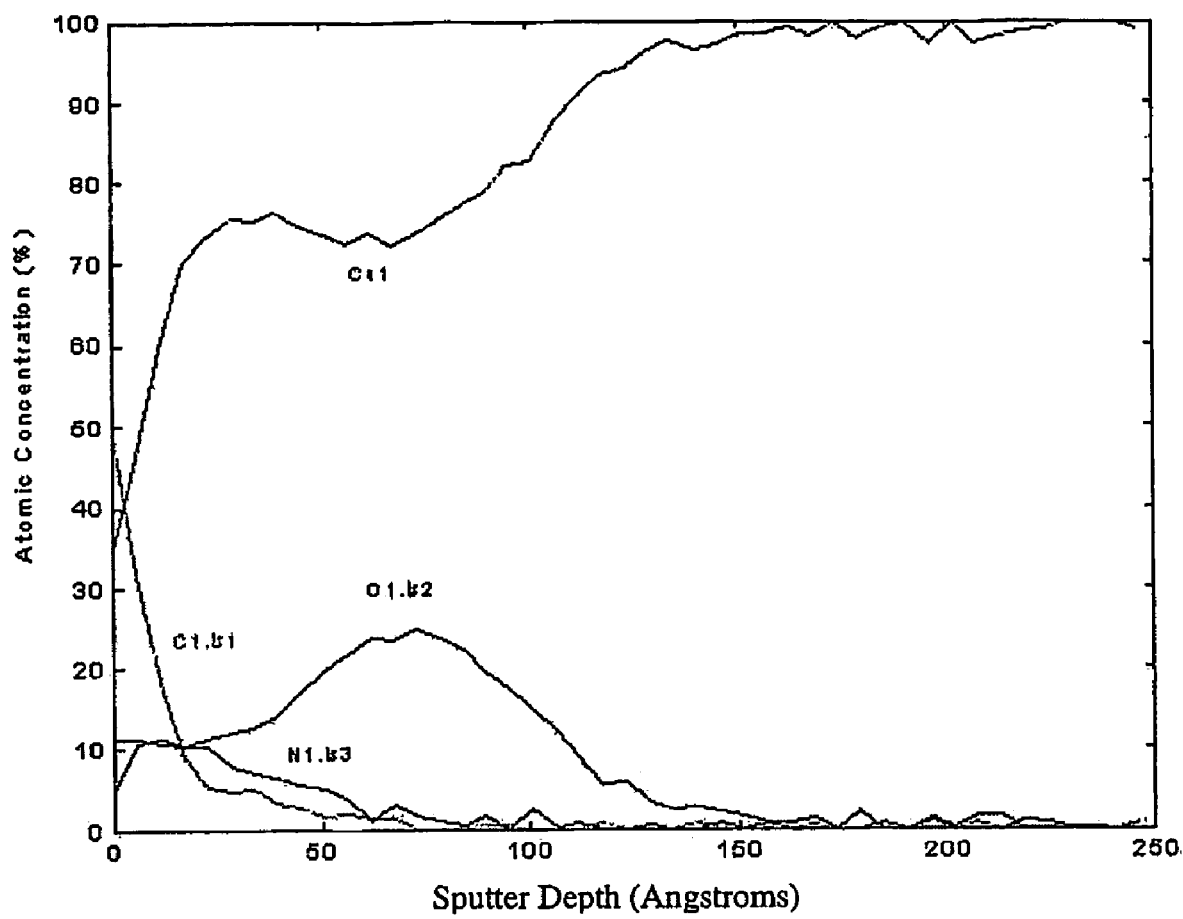
FIG. 6 is an Auger depth profile of the elemental composition for the sample in Example 3. The depth indication is based on an assumed sputter rate for silicon dioxide.

Copper nitride is deposited by a vacuum deposition technique as follows. Helium gas at a pressure of approximately 1 atmosphere pressure is passed through a nozzle situated approximately 10 cm above a copper-coated silicon wafer in a vacuum chamber. The substrate is heated to approximately 120° C. An electric discharge between an anode and a copper hollow cathode sputtering target inside the nozzle introduce copper atoms and ions into the helium. Nitrogen gas is introduced below the nozzle to produce a background pressure of approximately 30 mtorr of nitrogen. The interaction of the copper atoms or ions with the nitrogen causes the deposition of copper nitride on the surface. FIG. 6 shows an Auger elemental depth profile for the sample produced in this experiment. The depth profile demonstrates the formation of a surface layer of copper nitride with a thickness of about 50 Angstroms on the copper-coated wafer. The oxygen seen at a greater depth is the copper oxide that existed on the surface before the deposition was begun, since no effort is made to remove surface oxides in this experiment.

Example 4

A layer of copper nitride with a thickness of approximately 300 Angstroms is formed on 1 mil diameter copper wire as follows. The wire is fed horizontally from a spool external to a vacuum chamber into the vacuum chamber through a small tube 3 cm in length and having an internal diameter of 1.5 mil. Midway along the tube, there is a connection at a right angle leading to a small vacuum pump that removes air that would otherwise enter the vacuum chamber. The wire exits the vacuum chamber through a similar tube, also connected to the small vacuum pump, on the opposite side of the vacuum chamber. Inside the vacuum chamber the wire passes below a nozzle with a 3 mm opening at a distance of about 4 cm. It is held above a metal plate under the nozzle at a height of about 1 mm from the plate by two smooth islets spaced 5 mm apart. The chamber is evacuated to about 500 mtorr by a large vacuum pump. Nitrogen gas is passed through the nozzle from a small chamber upstream from the nozzle where the pressure is about 5 torr. A plasma is produced in the nitrogen upstream from the nozzle by applying a radio frequency alternating current of about 100 W to two electrodes inside the small chamber upstream from the nozzle. The nitrogen plasma then exits the nozzle and impinges onto the wire. The feed rate of the wire is controlled to produce a copper nitride layer thickness of about 300 Angstroms.

Example 5

A layer of copper nitride with a thickness of approximately 500 Angstroms is formed on 1.0 mil diameter copper wire as follows. The wire is fed horizontally from a spool external to a vacuum chamber into the vacuum chamber through a small tube 3 cm in length and having an internal diameter of 1.5 mil. Midway along the tube, there is a connection at a right angle leading to a small vacuum pump that removes air that would otherwise enter the vacuum chamber. The wire exits the vacuum chamber through a similar tube, also connected to the small vacuum pump, on the opposite side of the vacuum chamber. Inside the vacuum chamber the wire passes below a nozzle with a 3 mm opening at a distance of about 4 cm. It is held above a metal plate under the nozzle at a height of about 1 mm from the plate by two smooth islets spaced 5 mm apart. The chamber is evacuated to about 500 mtorr by a large vacuums pump. The small chamber upstream from the nozzle is equipped with two electrodes to which a radio frequency alternating current can be applied to produce a plasma in the chamber. In a first pass of the wire under the nozzle, oxygen gas at a pressure of 5 torr is introduced into the small chamber and a plasma is struck between the electrodes using about 100 W of r.f. power. The wire is fed under the nozzle at such a rate as to oxidize the outer 500 Angstroms of copper of the copper wire. Once a copper oxide layer has been produced on the entire spool of wire, the gas passing through the small chamber upstream from the nozzle is switched to 5 torr of nitrogen and a plasma is again produced in this gas. The wire is then fed under the nozzle again to convert the copper oxide to copper nitride. The feed rate is adjusted to convert more than 75% of the copper oxide to copper nitride.

What is claimed is:

1. A method of forming an interconnect structure in a semiconductor device or package comprising the steps of:
    providing at least one metallic interconnect element comprising Cu, the at least one metallic interconnect element being selected from the group consisting of a bond pad, a wire, a lead frame, a ball grid array, a stud bump, TAB, C4 or solder bumps, and combinations of two or more of these;
    oxidizing a surface of the at least one metallic interconnect element;
    forming on at least one of said interconnect elements, after the oxidizing step, a bonding surface layer comprising Cu (N) in an amount effective to substantially inhibit oxidation of underlying metallic layers;
    forming an electrically conductive bond in the location of said surface layer; and
    prior to or substantially simultaneous with said bond forming step, decomposing said Cu (N) to substantially increase the conductivity of said layer.

2. The method of claim 1 wherein said interconnect structure comprises a semiconductor package having a die with at least one copper bond pad; a substrate for said die; and a surface layer comprising Cu (N).

3. The method of claim 2 wherein said bond forming step comprises ultrasonic or thermosonic bonding.

4. The method of claim 1 wherein the oxidizing step includes exposing the at least one metallic interconnect element to oxygen.

5. The method of claim 1 comprising the step of exposing said surface of the at least one metallic interconnect element to heat prior to or at about the time of said oxidizing step.

6. The method of claim 1 wherein said bonding surface layer forming step comprises the step of exposing the at least one interconnect element to nitrogen plasma.

7. The method of claim 1 wherein said bonding surface layer forming step comprises the step of exposing the at least one interconnect element to ammonia.

8. The method of claim 1 further comprising exposing the at least one interconnect element to heat prior to or at about the time of said bonding surface layer forming step.

9. The method of claim 1 wherein said bonding surface layer forming step comprises exposing the at least one interconnect element to anhydrous ammonia.

10. A method of forming an interconnect structure in a semiconductor device comprising the steps of:
    providing at least one conductive interconnect element comprising Cu;
    oxidizing a surface of the at least one conductive interconnect element;
    forming on said interconnect element a bonding surface layer comprising Cu (N) after the oxidizing step; and
    forming an electrically conductive bond in the location of said bonding surface layer.

11. The method of claim 10 wherein said at least one conductive interconnect element is a wire comprising copper.

12. The method of claim 11 wherein said bonding surface forming step comprises exposing a surface portion of said wire to a gas containing nitrogen.

13. The method of claim 11 wherein said bonding surface forming step comprises exposing at least a surface portion of said wire to nitrogen plasma.

14. The method of claim 11 wherein said bonding surface forming step comprises converting at least a portion of said oxidized surface of the wire to copper nitride.

15. The method of claim 10 wherein said oxidizing step comprises exposing a surface layer of the at least one conductive interconnect element to oxygen plasma.

16. The method of claim 10 wherein said oxidizing step comprises exposing a surface layer of the at least one conductive interconnect element to hot oxygen gas.

17. The method of claim 10 wherein said oxidizing step comprises exposing a surface layer of the at least one conductive interconnect element to an oxidizing agent.

18. The method of claim 10 wherein said oxidizing step comprises electrochemically oxidizing a surface layer of the at least one conductive interconnect element.

19. The method of claim 14 wherein said conversion comprises exposing said oxidized surface to nitrogen plasma.

20. The method of claim 14 wherein said conversion comprises exposing said oxidized surface to gaseous ammonia.

* * * * *